United States Patent

Werner et al.

[11] Patent Number: 6,146,982
[45] Date of Patent: *Nov. 14, 2000

[54] METHOD FOR PRODUCING A LOW-IMPEDANCE CONTACT BETWEEN A METALLIZING LAYER AND A SEMICONDUCTOR MATERIAL

[75] Inventors: Wolfgang Werner; Klaus Wiesinger, both of München; Andreas Preussger, Vaterstetten, all of Germany

[73] Assignee: Infineon Technologies AG, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/853,158

[22] Filed: May 8, 1997

Related U.S. Application Data

[63] Continuation of application No. 08/534,057, Sep. 25, 1995, abandoned.

[30] Foreign Application Priority Data

Sep. 23, 1994 [DE] Germany .............................. 44 34 108

[51] Int. Cl.[7] ....................... H01L 21/336; H01L 21/331; H01L 21/3205
[52] U.S. Cl. .......................... 438/586; 438/273; 438/373; 438/527; 438/657; 438/719
[58] Field of Search ................................... 438/199, 232, 438/373, 527, 657, 658, 719, 273, 586

[56] References Cited

U.S. PATENT DOCUMENTS

| | | | |
|---|---|---|---|
| 4,503,598 | 3/1985 | Vora et al. | 437/203 |
| 4,772,566 | 9/1988 | Zdebel et al. | 437/26 |
| 4,879,254 | 11/1989 | Tsuzuki et al. | 437/41 |
| 4,898,835 | 2/1990 | Cawlfield | 437/29 |
| 5,023,191 | 6/1991 | Saksvai | 437/29 |
| 5,171,705 | 12/1992 | Choy | 437/29 |
| 5,182,222 | 1/1993 | Malhi et al. | 438/273 |
| 5,223,734 | 6/1993 | Lowrey et al. | 437/12 |
| 5,366,914 | 11/1994 | Takahashi et al. | 437/41 |
| 5,523,246 | 6/1996 | Yang | 437/34 |

OTHER PUBLICATIONS

Patents Abstracts of Japan, vol. 17, No. 463 [E–1426] Aug. 24, 1993: & JP–A–5–109643 (Matsushita) Apr. 30, 1993.
Patents Abstracts of Japan, vol. 18, No. 221 [E–1540] Apr. 20, 1994; & JP–A–6–20995 (NEC) Jan. 28, 1994;.

Primary Examiner—John F. Niebling
Assistant Examiner—Ha Tran Nguyen
Attorney, Agent, or Firm—Herbert L. Lerner; Laurence A. Greenberg; Werner H. Stemer

[57] ABSTRACT

A method for producing a low-impedance contact between a metallizing layer and a semiconductor material of a first conductivity type having a semiconductor surface, an insulation layer on the semiconductor surface and a semiconductor layer on the insulation layer, includes applying a first insulating layer with a predetermined content of dopants on the semiconductor layer, and structuring the first insulating layer by anisotropic etching, forming first and second openings. The semiconductor layer is anisotropically etched by using the first insulating layer as a mask. A first dopant of a second conductivity type is implanted and driven through the first opening into the semiconductor material with a first phototechnique, forming a first zone in the semiconductor material. A second dopant of the first conductivity type is implanted through the second opening into the semiconductor material with a second phototechnique. A second doped insulating layer is applied over the entire surface. The second insulating layer is anisotropically back-etched down to the semiconductor surface, with peripheral insulating webs remaining in the first opening. The semiconductor material is self-adjustingly anisotropically etched down to the first zone, by using the second insulating layer as a mask. A third dopant of higher doping and of the second conductivity type is implanted into the first zone by using the second insulating layer as a mask. A metallizing layer is applied.

7 Claims, 5 Drawing Sheets

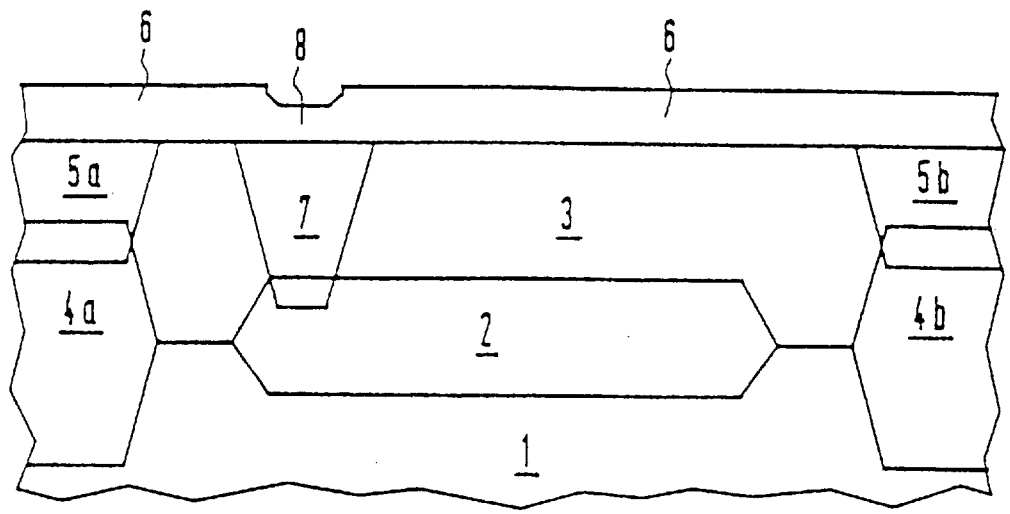
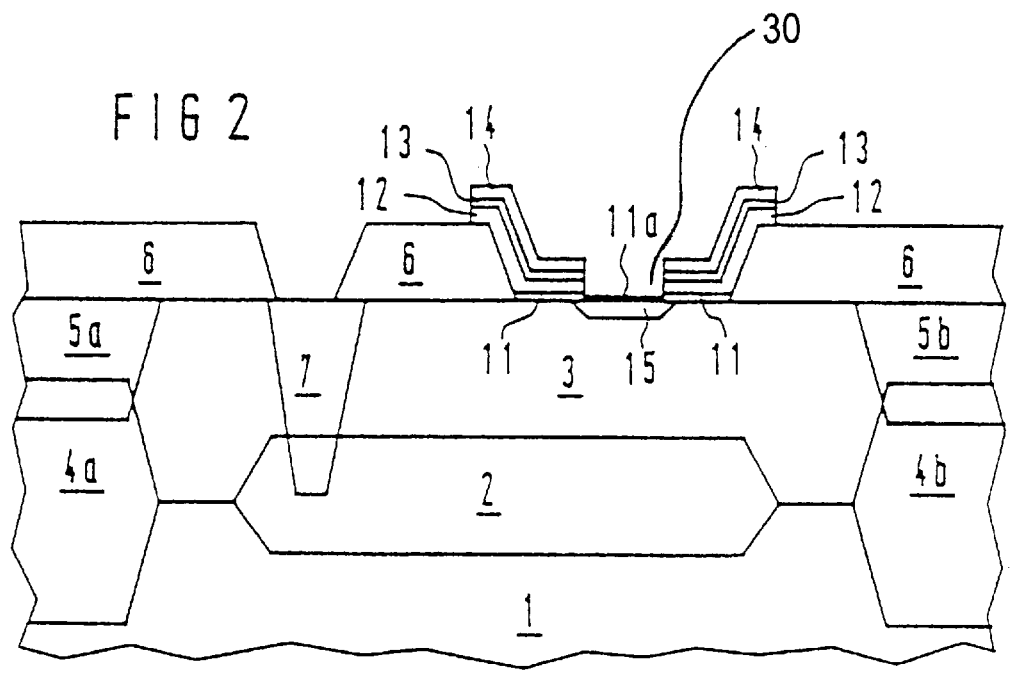

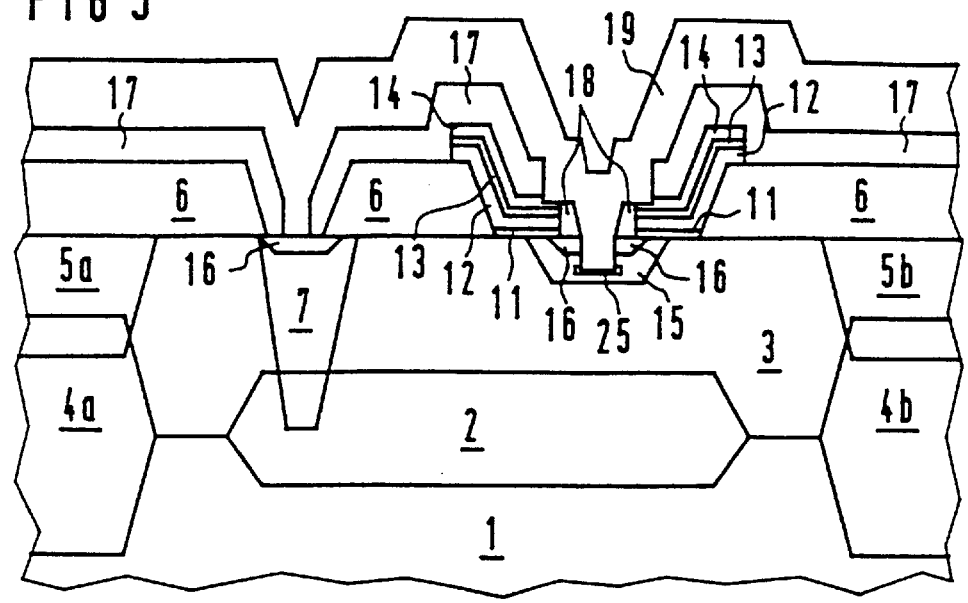
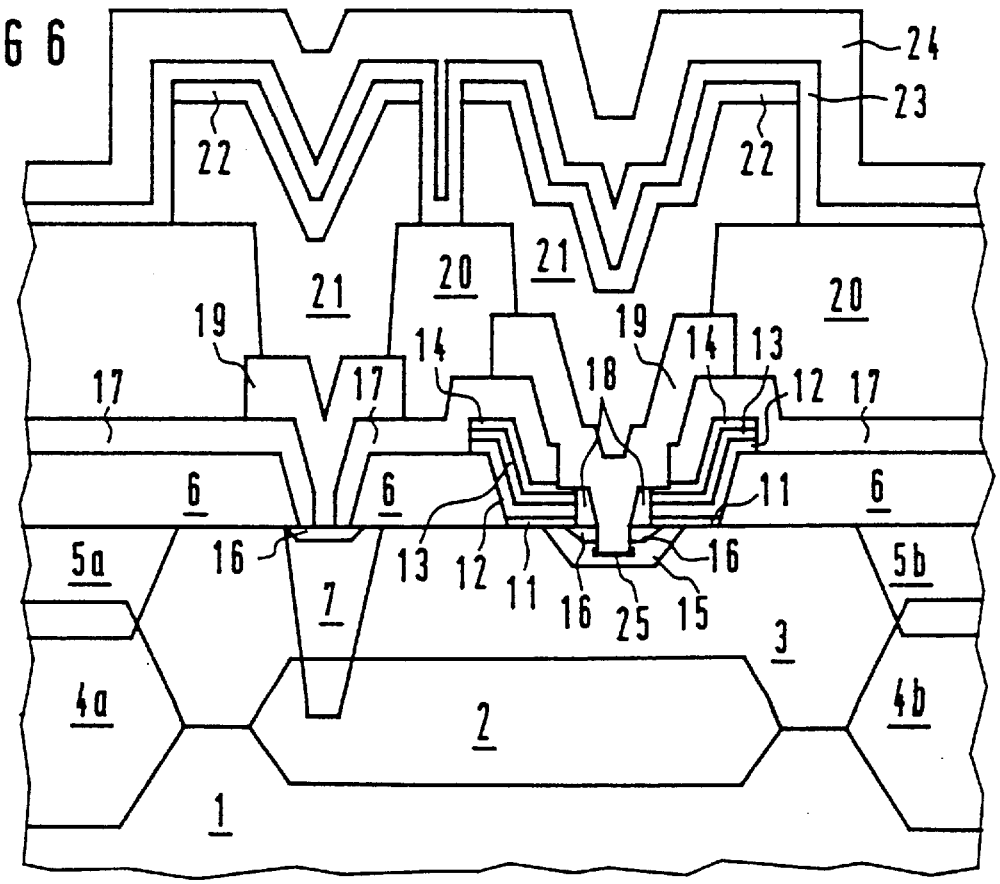

METHOD FOR PRODUCING A LOW-IMPEDANCE CONTACT BETWEEN A METALLIZING LAYER AND A SEMICONDUCTOR MATERIAL

This application is a continuation of application Ser. No. 08/534,057, filed on Sep. 25, 1995, now abandoned.

BACKGROUND OF THE INVENTION

Field of the Invention

The invention relates to a method for producing a low-impedance contact between a metallizing layer and a semiconductor material of a first conductivity type having a semiconductor surface, an insulation layer on the semiconductor surface and a semiconductor layer on the insulation layer.

One such contact is known, for instance, from U.S. Pat. No. 4,898,835. The insulating layer and the semiconductor layer are defined therein by the gate oxide and the gate of the MOS power transistor. The known structure is predominantly suited for individual components, but not for integrated circuits with power elements.

SUMMARY OF THE INVENTION

It is accordingly an object of the invention to provide a method for producing a low-impedance contact between a metallizing layer and a semiconductor material, which overcomes the hereinafore-mentioned disadvantages of the heretofore-known methods of this general type and which leads to a smaller contact area and a lower contact resistance.

With the foregoing and other objects in view there is provided, in accordance with the invention, in a method for producing a low-impedance contact between a metallizing layer and a semiconductor material of a first conductivity type having a semiconductor surface, an insulation layer on the semiconductor surface and a semiconductor layer on the insulation layer, the improvement which comprises applying a first insulating layer with a predetermined content of dopants on the semiconductor layer, and structuring the first insulating layer by anisotropic etching, forming an opening; anisotropically etching the semiconductor layer by using the first insulating layer as a mask; implanting and driving a first dopant of a second conductivity type through the first opening into the semiconductor material with a first phototechnique, forming a first zone in the semiconductor material; implanting a second dopant of the first conductivity type through the opening into the semiconductor material with a second phototechnique; applying a second doped insulating layer over the entire surface; back-etching the second insulating layer anisotropically down to the semiconductor surface, with peripheral insulating webs remaining in the opening; self-adjustingly anisotropically etching the semiconductor material down to the first zone, by using the second insulating layer as a mask; implanting a third dopant of higher doping and of the second conductivity type into the first zone by using the second insulating layer as a mask; and applying a metallizing layer.

The invention achieves the advantage of attaining a smaller contact opening without having to take into account a number of adjustment reservations. Due to the smaller area of the contact region, there is a lower turn-on resistance, and therefore the power and switching loss that must be dissipated require less expenditure to be made for cooling. Moreover, this invention makes it possible to reduce parasitic effects, so that even in critical cases, it is possible to control the switching properties through the structured semiconductor layer or gate. Due to the reduced resistance between the contact region and the channel zone, a more-stable breakdown behavior of the configuration results. All of the diffusions involved in the method are self-adjusted to the structured semiconductor layer.

In accordance with another mode of the invention, there is provided a method which comprises applying a further insulating layer in addition to the first insulating layer, and approximately identically structuring both layers.

In accordance with a further mode of the invention, there is provided a method which comprises thinning the insulation layer prior to the implantation of the first dopant.

In accordance with an added mode of the invention, there is provided a method which comprises producing a medium conductivity with the first dopant, and producing a high conductivity in the respective implanted zone with the second and third dopants.

In accordance with an additional mode of the invention, there is provided a method which comprises applying the second doped insulating layer with substantially the same thickness as the first doped insulating layer.

In accordance with yet another mode of the invention, there is provided a method which comprises structuring the second doped insulating layer forming insulation webs laterally bordering on the insulating layer, the semiconductor layer, and the first insulating layer.

In accordance with yet a further mode of the invention, there is provided a method which comprises densifying the second doped insulating layer prior to its being structured.

Other features which are considered as characteristic for the invention are set forth in the appended claims.

Although the invention is illustrated and described herein as embodied in a method for producing a low-impedance contact between a metallizing layer and a semiconductor material, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1–5 are fragmentary, diagrammatic, cross-sectional views illustrating the method of the invention;

FIG. 6 is a fragmentary, cross-sectional view illustrating an integrated contact region of a DMOS transistor of FIGS. 1–5.

DESCRIPTION OF THE PREFERRED EMBODIMENTS

Figure 3:
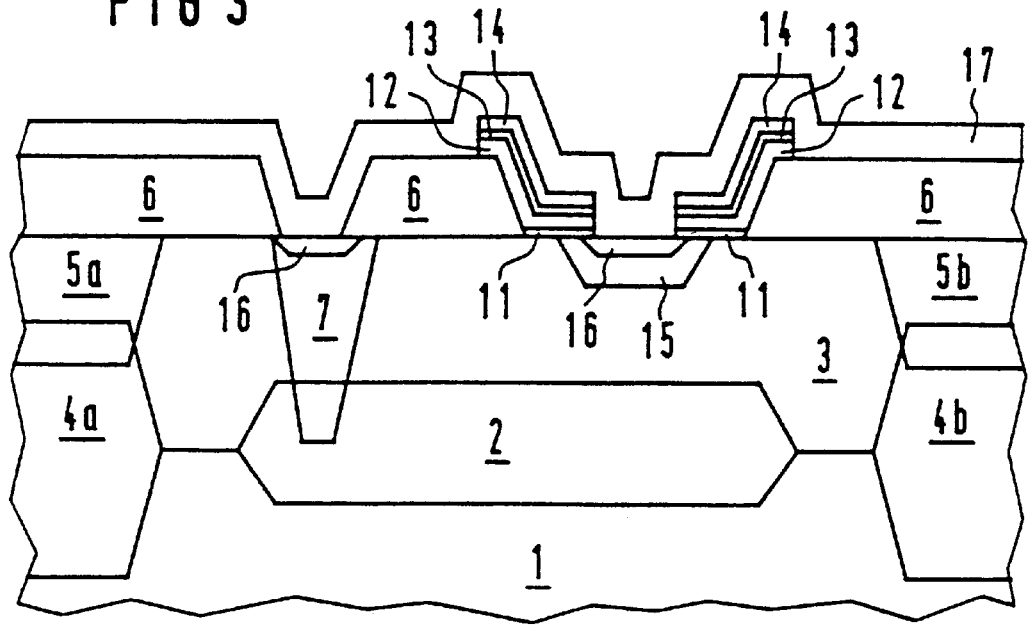

Referring now to the figures of the drawing in detail and first, particularly, to FIG. 1 thereof, there is seen a structure which is the point of departure for the invention. An n-doped well 3 is disposed, for instance epitaxially, above a semiconductor material 1 with boron doping and with an arbitrary orientation. The well 3 is contacted with low impedance through a high-conductivity zone or well terminal 2. The well 3 is insulated by p-doped regions 4a, 4b and 5a and 5b, each of high conductivity. The low-impedance well terminal 2 is connected to the surface of the well 3 by a low-diffusion zone 7 of high conductivity. The low-diffusion zone 7 is produced by first structuring an insulation layer 6, for instance of silicon oxide, that covers the surface of the configuration. Subsequently, for instance through the use of oven coating, an n-doped layer of high conductivity is produced in the well and is then driven in. The result is a thermally produced oxide 8 on the structured surface.

A p-well can be made in some other region of the semiconductor configuration in a corresponding way.

Active component regions are produced with FIG. 1 as the point of departure. To that end, in FIG. 2, the oxide layer 6 is first structured through the use of a standard phototechnique and wet-chemical etching. The oxide angle can be adjusted with a preimplantation of a low dose. By way of example, this preimplantation may be a full-surface argon implantation. This is followed by other steps that are known per se. In CMOS transistors, the operating voltage of the transistors can be adjusted through the use of suitable low-dose doping.

In the next step, the production of an insulation layer 11, for instance in the form of thermally produced silicon oxide, is carried out. In MOS transistors, this layer performs the function of a gate insulation. Subsequently, a semiconductor layer 12 is applied, for example a polysilicon layer. The layer 12 is doped to high conductivity through the use of oven coating. A gate of an MOS transistor or a resistor or a conductor track is produced from this layer.

In the next step, a first insulating layer 13 with a predetermined content of dopants is applied to the semiconductor layer 12. This first insulating layer acts as a gettering layer. The content of dopants is chosen in such a way that a gettering effect occurs. This first insulating layer 13 is intended to have low flow properties. For example, the first insulating layer may be a boron phosphorus silicate glass layer (BPSG). A sandwich of two layers 13 and 14 is also possible. The lower layer 13 is preferably doped with phosphorus or boron, while the upper layer 14 may be undoped. In an extreme case, the first insulating layer 13 may also be undoped, if a second insulating layer to be applied later is doped. The preferably used double layer being formed of a doped oxide 13 and an undoped oxide 14, typically TEOS, is then structured and forms an opening 30 (FIG. 2) through the use of a standard phototechnique and is anisotropically etched.

Using the first insulating layer 13, 14 as a mask, the semiconductor layer 12 is then anisotropically etched such that the opening 30 extends at least to the insulation layer 11, as is illustrated in FIG. 2. An ensuing thinning of the exposed insulation layer 11 to a stray oxide thickness 11a through the use of anisotropic or isotropic etching is possible.

In the next step, the implantation of a p-doped dopant 15 of medium conductivity into the semiconductor material is performed. The resultant configuration is shown in FIG. 2.

After the p-doped layer 15 has been driven in, in the exemplary embodiment this zone performs the function of the body of a DMOS transistor. In other configurations, this zone can perform the function of the base of an npn transistor, the source or drain of a PMOS transistor, the emitter of a pnp transistor, or a diffusion resistor. The phototechnique contemplated for the implantation is a standard photoresist technique.

Through the use of a photostandard photoresist technique, n-doped zones 16 of high conductivity are implanted in the semiconductor material and driven in. Their intended function may be to act as the source of the DMOS transistor or the emitter of an npn transistor, or the source and drain of an NMOS transistor. Following the driving in of the n-doped layers 16, the application of a second insulating layer 17 is carried out, as is seen in FIG. 3. The second insulating layer is preferably a phosphorus-containing or boron-containing oxide and has a thickness similar to that of the first insulating layer, or to the total of the sandwich layers 13 and 14. The second insulating layer may, for instance, again be a boron phosphorus silicate glass layer. Next, the layer 17 can be densified in an oven process, in which the layer is not intended to flow strongly.

Figure 4:
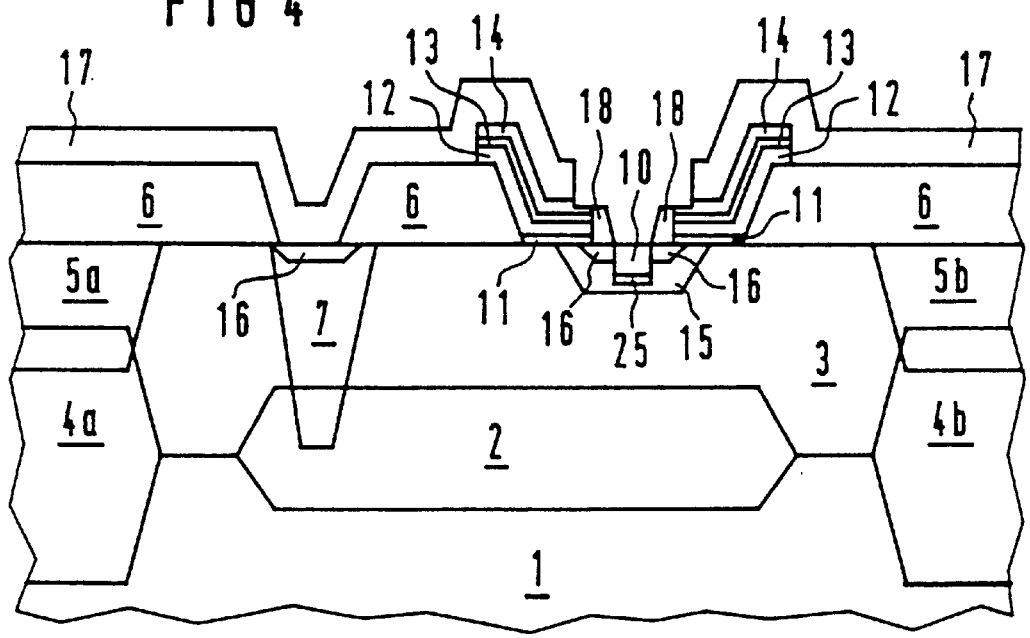

In the next method step, structuring of the second insulating layer 17 with the aid of a further phototechnique and an anisotropic etching down to the semiconductor surface is contemplated. This causes the etching step to stop at the semiconductor surface. Using the thus-produced structure of the layer 17 in the region of the contact that is to be produced as a mask, the semiconductor material is then etched, as is seen in FIG. 4. Due to a spacer or peripheral insulating webs 18 formed by the layer 17, a resultant trench 10 has a fixed spacing from the structured semiconductor layer 12, or in other words from the edge of the polysilicon.

Subsequently, a high-dose p-dopant 25 is implanted in the semiconductor material, or in other words in the bottom of the silicon trench that has been made, as a third insulating material. The function of this step is to reduce the contact resistances or, in another configuration, the emitters of a pnp transistor. The masking in this step again takes place through the use of the second insulating layer 17. In the next step, shown in FIG. 5, a metallizing layer 19, for instance of aluminum, is applied over the entire surface. This layer has the function of electrically contacting the semiconductor material, or of acting as a conductor track.

The ensuing steps for producing the semiconductor structures are equivalent to the steps known from the prior art. For example, the oxide 17, prior to the application of the metallizing layer 19, can be structured through the use of a standard phototechnique and wet-chemical or anisotropic etching to produce contacts without silicon trenches, as is seen in FIG. 5. After the application of the metallizing layer, this layer is structured; an insulation layer 20, typically TEOS, is deposited and structured; and planarization of the surface of the resultant configuration is carried out. This is followed by an application and structuring of a second conductive layer 21, forming contacts between the first and second conductive layers. Subsequently, a further insulation layer 22 is deposited and structured. An additional insulation layer 23, typically a phosphorus-containing oxide, is applied, and a silicon nitride layer 24 is provided over the layer 23 as a passivation layer, as is seen in FIG. 6.

The method explained in conjunction with FIGS. 1–6 is suitable for producing integrated circuits with various types of components. While FIGS. 1–6 show the production of an n-channel DMOS transistor with a drain or source contact on the top of the semiconductor wafer, FIGS. 7–10 show other types of components while keeping the same reference numerals.

Figure 7:
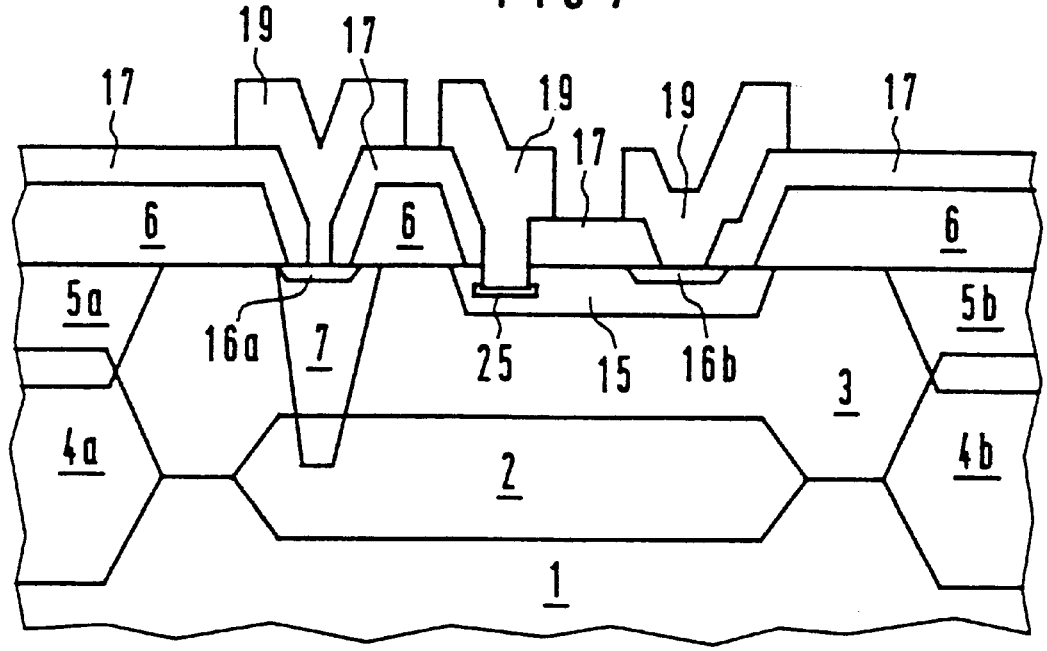
FIGS. 7–10 are fragmentary, cross-sectional views illustrating further exemplary embodiments of the method according to the invention, for various types of transistors.

The npn transistor of FIG. 7 has a zone 16a which is a collector contact that contacts the collector 3 through collector deep diffusion to the buried zone 2. A zone 15 represents a base and a zone 16b represents an emitter.

Figure 8:
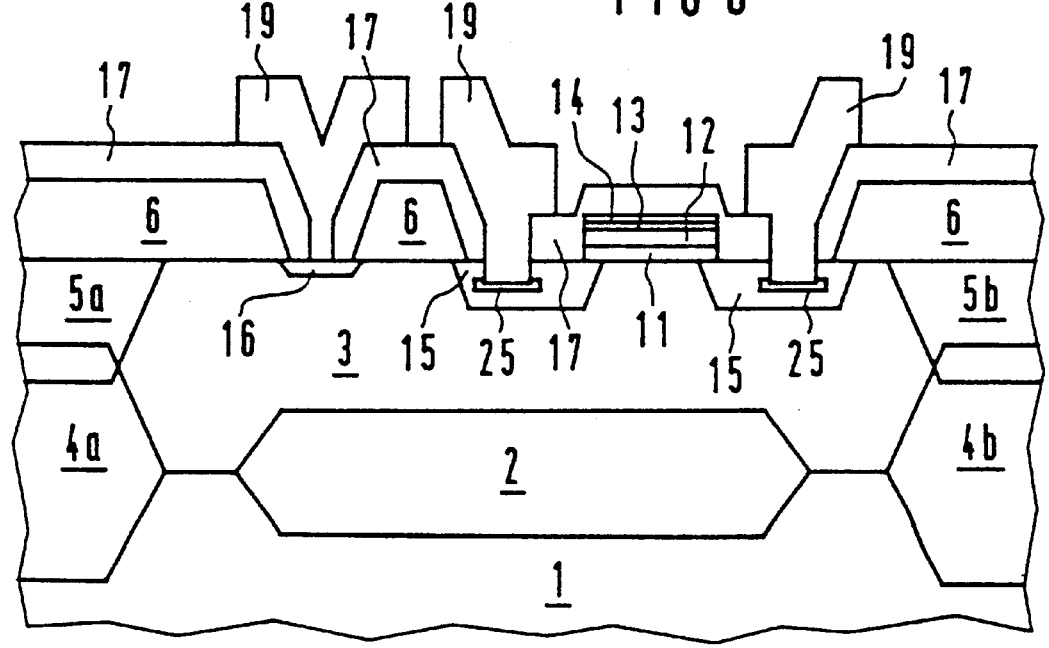
Figure 9:
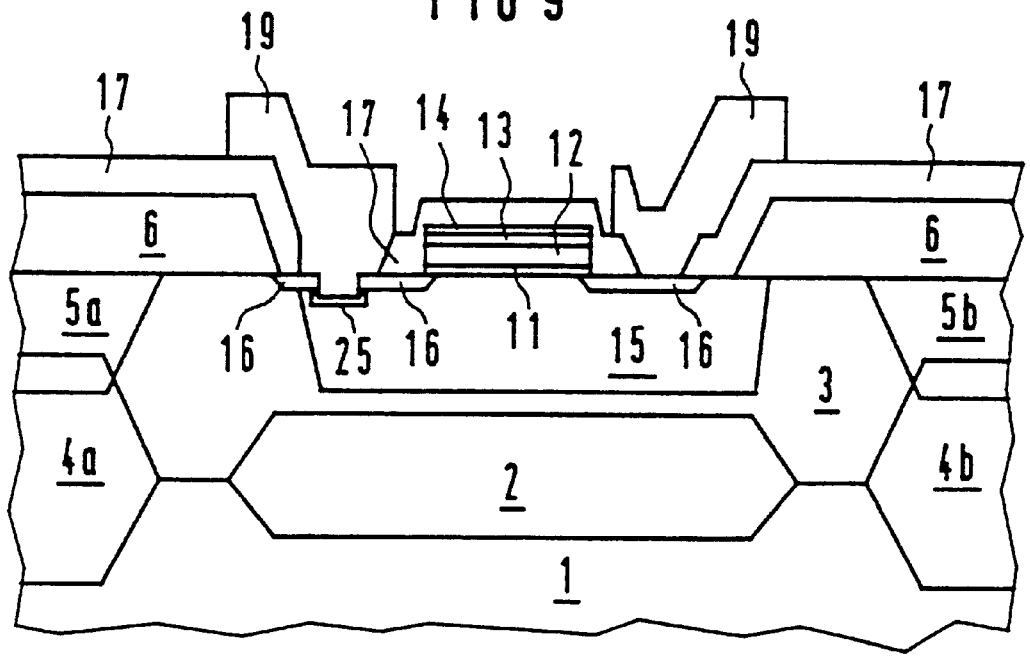

FIGS. 8 and 9 show low-voltage CMOS transistors. A zone 15 in FIG. 8 for a PMOS transistor and a zone 16 in FIG. 9 for an NMOS transistor are source and drain zones, respectively. In FIG. 9, the zone 15 is intended to be a p-well for the NMOS transistor.

With the aid of the method of the invention, high-depletion p-channel transistors, resistors, capacitors and diodes can also be made. All of the components are insulated from one another by p-n junctions.

Figure 10:
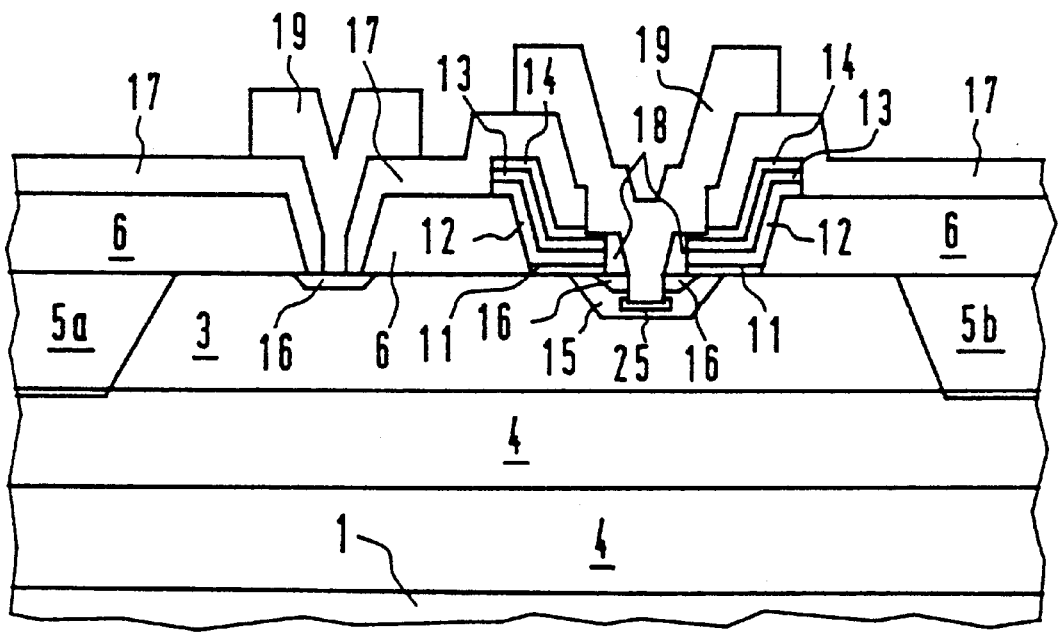

In order to produce integrated circuits with DMOS transistors having a drain contact which is located on the back side of the wafer, individual steps, that are familiar to one skilled in the art, can be left out prior to the production of the active component regions. An n-conductive silicon with high conductivity and with a predetermined orientation is used as the basic material. At the end of the entire production process, provision is made for applying a conductive layer to the back side of the wafer. A resultant high-depletion insulated lateral n-channel DMOS transistor is shown in FIG. 10.

The method of the invention is also suitable for producing DMOS individual transistors. In the production process described in terms of FIGS. 1–6, individual steps can then be modified or left out, without changing the core concept of the invention to be the subject of patent protection. In this case as well, n-conductive silicon of high conductivity and of a given orientation is used as the base material, and at the end of the process a conductive layer must be applied on the back side of the wafer.

We claim:

1. In a method for producing a contact between a metallizing layer and a semiconductor material of a first conductivity type having a semiconductor surface, an insulation layer on the semiconductor surface and a semiconductor layer on the insulation layer, the improvement which comprises:

applying a first insulating layer with a content of dopants on the semiconductor layer, and structuring the first insulating layer by anisotropic etching, forming an opening;

anisotropically etching the semiconductor layer by using the first insulating layer as a mask;

implanting and driving a first dopant of a second conductivity type through the opening into the semiconductor material with a first phototechnique, forming a first zone in the semiconductor material;

implanting a second dopant of the first conductivity type through the opening into the semiconductor material with a second phototechnique, forming a second zone of the first conductivity type in an upper region of the first zone;

applying a second doped insulating layer over the entire surface;

back-etching the second doped insulating layer anisotropically down to the semiconductor surface of the semiconductor material at least in a region of the opening, with an insulating sidewall spacer remaining in the opening;

anisotropically etching the semiconductor material down to the first zone for forming a top surface, by using the second doped insulating layer and the insulating side wall spacer as a mask;

implanting a third dopant of the second conductivity type into the first zone by using the second doped insulating layer and the insulating side wall spacer as a mask; and applying a metallizing layer on the top surface.

2. The method according to claim 1, which comprises applying a further insulating layer on the first insulating layer, and substantially identically structuring the first insulating layer and the further insulating layer.

3. The method according to claim 1, which comprises thinning the insulation layer prior to the implantation of the first dopant.

4. The method according to claim 1, which comprises producing a first conductivity with the first dopant, and producing a second conductivity in the respective implanted zone with the second and third dopants, the second conductivity being greater than the first conductivity.

5. The method according to claim 1, which comprises applying the second doped insulating layer with substantially the same thickness as the first insulating layer.

6. The method according to claim 1, which comprises structuring the second doped insulating layer forming an insulation sidewall spacer laterally bordering on the insulation layer, the semiconductor layer, and the first insulating layer.

7. The method according to claim 1, which comprises densifying the second doped insulating layer prior to its being structured.

* * * * *